United States Patent
Ahn et al.

(10) Patent No.: US 11,553,604 B2
(45) Date of Patent: Jan. 10, 2023

(54) DISPLAY APPARATUS

(71) Applicant: LG Display Co., Ltd., Seoul (KR)

(72) Inventors: Min-Sik Ahn, Paju-si (KR); Jin-Young Bang, Paju-si (KR); Ji-Yeon Oh, Yongin-si (KR); Dong-Kwan Yoo, Pyeongtaek-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/135,291

(22) Filed: Dec. 28, 2020

(65) Prior Publication Data

US 2021/0204416 A1 Jul. 1, 2021

(30) Foreign Application Priority Data

Dec. 31, 2019 (KR) .................. 10-2019-0179269

(51) Int. Cl.
*H05K 7/20* (2006.01)
*H05K 5/00* (2006.01)

(52) U.S. Cl.
CPC ....... *H05K 5/0017* (2013.01); *H05K 7/20963* (2013.01)

(58) Field of Classification Search
CPC ... G06F 1/203; H05K 5/0017; H05K 7/20963
See application file for complete search history.

(56) References Cited

U.S. PATENT DOCUMENTS

| | | | | |
|---|---|---|---|---|
| 9,851,492 B2* | 12/2017 | Shin | ..................... | G02B 6/0088 |
| 2008/0285290 A1* | 11/2008 | Ohashi | ................. | G02B 6/0085 |
| | | | | 362/373 |
| 2014/0002969 A1* | 1/2014 | Hwang | ................. | G06F 1/1601 |
| | | | | 361/679.01 |
| 2014/0085779 A1* | 3/2014 | Delva | ................. | H05K 7/1417 |
| | | | | 361/679.01 |
| 2016/0147107 A1* | 5/2016 | Cho | .................. | G02F 1/133308 |
| | | | | 349/58 |
| 2016/0187573 A1* | 6/2016 | Kim | ....................... | G02B 6/009 |
| | | | | 362/606 |
| 2017/0118859 A1* | 4/2017 | Kang | .................... | H05K 7/1427 |
| 2017/0345874 A1* | 11/2017 | Kim | ....................... | H01L 27/32 |
| 2018/0356674 A1* | 12/2018 | Son | .................... | G02F 1/133308 |

FOREIGN PATENT DOCUMENTS

| | | |
|---|---|---|
| CN | 105118388 A | 12/2015 |
| CN | 107705726 A | 2/2018 |
| CN | 209861400 U | 12/2019 |
| KR | 10-2018-0118842 A | 11/2018 |
| KR | 10-2019-0024362 A | 3/2019 |

OTHER PUBLICATIONS

Seok. KR 20180118842 A translation (Year: 2018).*

* cited by examiner

*Primary Examiner* — Jacob R Crum
(74) *Attorney, Agent, or Firm* — Birch, Stewart, Kolasch & Birch, LLP

(57) ABSTRACT

Discussed is a display apparatus including a display panel, and a back cover coupled to a rear surface of the display panel. The back cover includes a hemming part formed to face a rear surface of the back cover by bending at least a portion of the back cover.

13 Claims, 4 Drawing Sheets

DISPLAY APPARATUS

CROSS-REFERENCE TO RELATED APPLICATIONS

This application claims the priority benefit of Korean Patent Application No. 10-2019-0179269, filed in the Republic of Korea on Dec. 31, 2019, the entire contents of which are hereby expressly incorporated by reference as if fully set forth herein into the present application.

BACKGROUND OF THE INVENTION

Field of the Invention

The present invention relates to a display apparatus, and more particularly, to a display apparatus in which a back cover is coupled to the rear surface of a display panel so as to simultaneously support the display panel and increase the stiffness thereof.

Discussion of the Related Art

As we have recently entered the information age, the field of displays for visually displaying electrical information signals has rapidly developed. In order to satisfy such development, various display apparatuses having excellent performance, such as thinness, light weight and low power consumption, are being developed.

As examples of such display apparatuses, there are a liquid crystal display (LCD) apparatus, an organic light emitting diode (OLED) display apparatus, and a quantum dot display apparatus.

Among such display apparatuses, self-luminous display apparatuses, which do not require separate light sources and can achieve compactness and clear color display, such as an organic light emitting diode (OLED) display apparatus, are considered as a competitive application. The OLED display apparatus includes light emitting diodes which are self-light emitting elements and provided in respective pixels to emit light. The light emitting diode includes two electrodes which are opposite to each other, and a light emitting layer which is arranged between the two electrodes to emit light when transported electrons and holes are recombined.

Organic light emitting diodes, which are self-light emitting diodes using a thin light emitting layer interposed between electrodes, are advantageous in that they can be formed into a thin film. Further, the organic light emitting diodes do not require any separate light source, and can thus be easily implemented as flexible, bendable and foldable display apparatuses so as to be designed in various shapes.

However, since the OLED display apparatus can realize light weight and thinness, it requires a mechanical structure for coupling a circuit board to the rear surface of the display panel, a heat radiation structure for transmitting and discharging heat from the display panel, and a structure for increasing stiffness to firmly support the rear surface of the display panel. Further these structures need to be combined or added and thus it can be difficult to apply these structures to the OLED display having light weight and thinness. Further, optimization for matching each service environment of the display apparatus would be required.

SUMMARY OF THE INVENTION

Accordingly, the present invention is directed to a display apparatus that substantially obviates one or more problems due to limitations and disadvantages of the related art.

An object of the present invention is to provide a display apparatus in which a back cover is coupled to the rear surface of a display panel so as to simultaneously increase or enhance stiffness and heat radiation performance.

Another object of the present invention is to provide a display apparatus in which a coupling structure can be formed so as to be coupled to an additional structure or a set by bending a portion of a back cover.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display apparatus includes a display panel, and a back cover coupled to a rear surface of the display panel, wherein the back cover includes a hemming part formed to face a rear surface of the back cover by bending at least a portion of the back cover.

The back cover can be formed in a rectangular shape, and the hemming part can be provided in respective edge areas of the back cover.

The display apparatus can further include a circuit board coupled to the hemming part on the rear surface of the back cover.

The hemming part can further include a forming part bent to protrude outwards from the hemming part.

The forming part can include a first plane bent from one side end of the back cover, a second plane bent from the first plane, and a third plane bent from the second plane and connected to the hemming part.

The hemming part can further include a space between the rear surface of the back cover and the forming part.

The hemming part can further include a heat radiation member inserted into the space.

The heat radiation member can include heat radiation pins coupled to heat radiation holes formed through the forming part.

The heat radiation member can include an extension member configured to extend between the first plane and the back cover so that at least a portion of the extension member is exposed to an outside of the space.

The forming part can further include a heat radiation pattern provided on at least one of the first plane, the second plane or the third plane.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
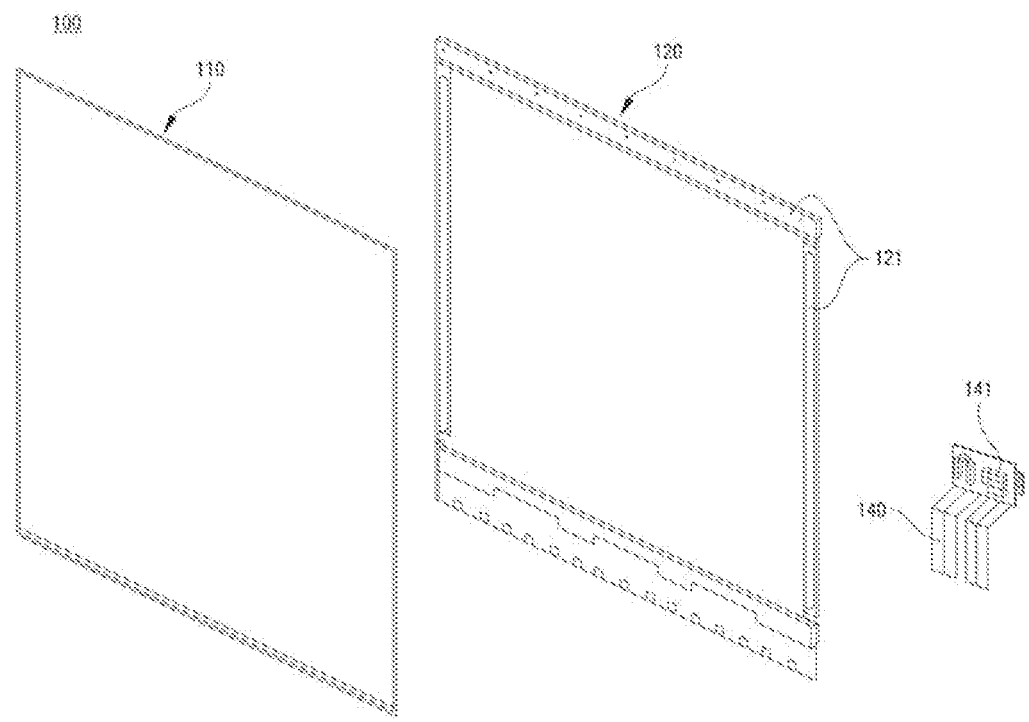
FIG. 1 is an exploded perspective view of a display apparatus according to one embodiment of the present invention.

Reference will now be made in detail to the exemplary embodiments of the present invention, examples of which are illustrated in the accompanying drawings. However, the present invention can be embodied in many alternative forms and should not be construed as limited to the embodiments set forth herein, the embodiments of the present invention are provided only to completely disclose the invention and to completely inform those skilled in the art of the scope of the invention, and it is intended that the present invention is defined by the appended claims.

Shapes, sizes, rates, angles and numbers disclosed in the drawings to describe the embodiments of the present invention are only exemplary and do not limit the present invention. In the following description of the embodiments and the drawings, the same or similar elements are denoted by the same reference numerals even when they are depicted in different drawings. In the following description of the embodiments of the present invention, a detailed description of known functions and configurations incorporated herein will be omitted when it can make the subject matter of the present invention rather unclear. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of characteristics, numbers, steps, operations, elements, parts or combinations thereof, or the possibility of adding the same, unless the term "only" is used. It will be understood that a singular expression encompasses a plural expression unless stated otherwise.

In the interpretation of elements included in the various embodiments of the present invention, it will be interpreted that the elements include error ranges even if there is no clear statement.

In the following description of the embodiments, it will be understood that, when positional relationships are expressed, for example, when an element is "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next to" and "before" are used, the terms encompass a continuous relationship between the events, or a discontinuous relationship between the events, unless the term "just" or "directly" is used.

In the following description of the embodiments, it will be understood that, when the terms "first", "second", etc. are used to describe various elements, these terms are used merely to discriminate the same or similar elements. Therefore, a first element described hereinafter can be a second element without departing from the technical scope of the invention.

In the following description of the embodiments, it will be understood that the terms "first", "second", "A", "B", "(a)", "(b)", etc. can be used to describe various elements. These terms are used merely to discriminate the corresponding elements from other elements, and do not limit the natures, sequences, order or numbers of the corresponding elements. When an element or layer is referred to as being "engaged with", "coupled to" or "connected to" another element or layer, it can be directly engaged with, coupled to or connected to the other element or layer or be engaged with, coupled to or connected to the other element or layer by yet another element, or intervening elements or layers can be "interposed" between the respective elements.

In the embodiments of the present invention, "display apparatuses" can include, in a narrow sense, display apparatuses, each of which includes a display panel and a driving unit to drive the display panel, such as a liquid crystal module (LCM), an organic light emitting diode (OLED) module and a quantum-dot (QD) module. Further, "display apparatuses" can include complete products (i.e., finished products) including an LCM, an OLED module and a QD module, such as a notebook computer, a TV, a computer monitor and an automotive display, other equipment display apparatuses for vehicles, and set electronic apparatuses or set apparatuses, such as a mobile electronic apparatus, i.e., a smartphone or an electronic pad.

Therefore, in the following description of the embodiments, display apparatuses can include, in a narrow sense, display apparatuses, such as an LCM, an OLED module and a QD module, and include application products or set apparatuses which are finished consumer products, including an LCM, an OLED module and a QD module.

Further, in some cases, an LCM, an OLED module or a QD module including a display panel and a driving unit can be referred to as a display apparatus in a narrow sense, and an electronic apparatus including an LCM, an OLED module or a QD module, i.e., a complete product, can be referred to as a set apparatus, discriminately. For example, the display apparatus in a narrow sense can conceptually include an LCD, OLED or QD display panel and a source PCB which is a controller to drive the display panel, and the set apparatus can conceptually further include a set controller conductively connected to the source PCB to control the entirety of the set apparatus.

As a display panel used in the embodiments of the present invention, all types of display panels, such as a liquid crystal display panel, an organic light emitting diode (OLED) display panel, a quantum-dot (QD) display panel and an electroluminescent display panel, can be used.

For example, when a liquid crystal display panel is used as the display panel, the display panel includes a plurality of gate lines, a plurality of data lines, and pixels formed at intersections between the gate lines and the data lines. Further, the display panel can include an array substrate including thin film transistors which are switching elements for respectively adjusting light transmittance in the pixels, an upper substrate having a color filter and/or a black matrix, and a liquid crystal layer formed between the array substrate and the upper substrate.

Alternatively, when an OLED display panel is used as the display panel, the display panel includes a plurality of gate lines, a plurality of data lines, and pixels formed at intersections between the gate lines and the data lines. Further, the display panel can include an array substrate including thin film transistors which are elements for selectively applying voltage to the respective pixels, an organic light emitting diode (OLED) layer formed on the array substrate, and an encapsulation substrate arranged on the array substrate so as to cover the OLED layer. The encapsulation substrate can protect the thin film transistors and the OLED layer from external impact, and prevent moisture or oxygen from permeating the OLED layer.

A layer formed on the array substrate can include an inorganic light emitting layer, for example, a nano-sized material layer or quantum dots.

Further, a pad part connected to respective signal lines provided in a pixel array can be provided at one side of the edge of the array substrate, and the pad part can be connected to a circuit board which drives the display panel.

Figure 2:
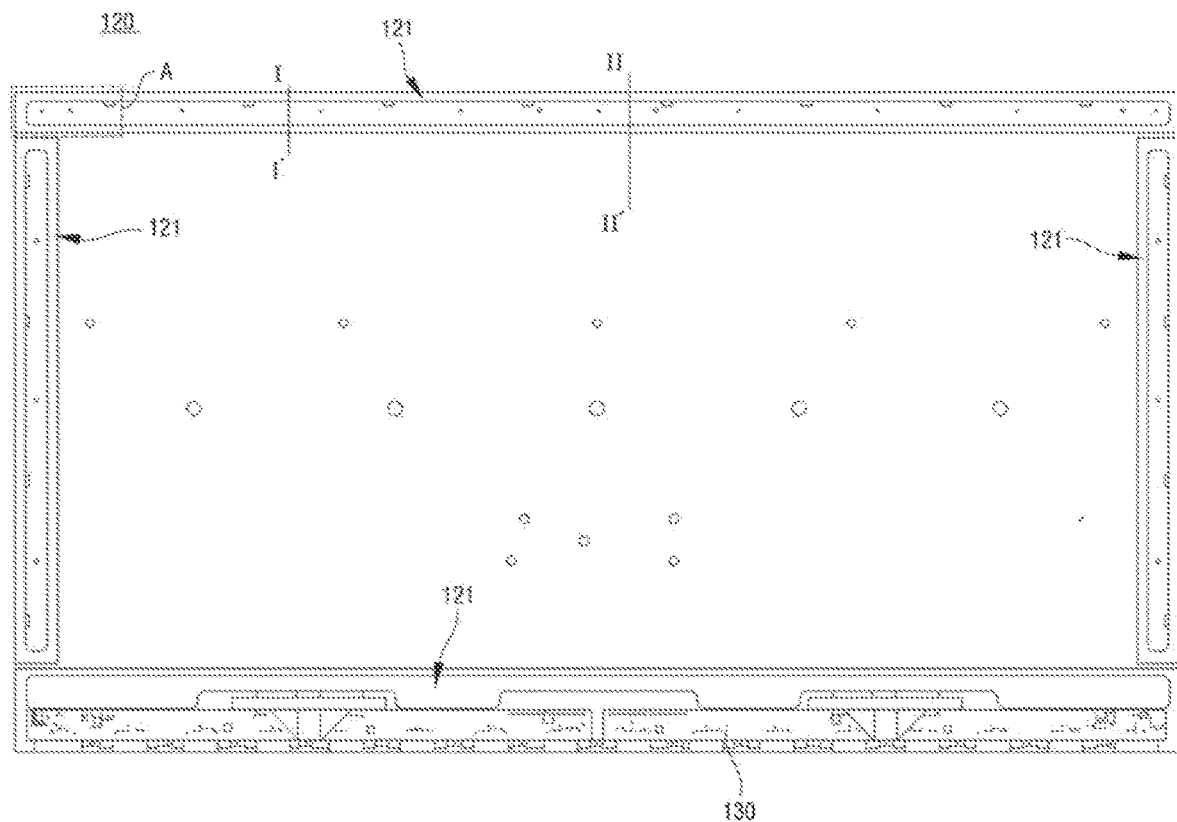
FIG. 2 is a rear view of a back cover of the display apparatus shown in FIG. 1.

FIG. 1 is an exploded perspective view of a display apparatus according to one embodiment of the present invention, and FIG. 2 is a rear view of a back cover of the display apparatus shown in FIG. 1. As a display panel according to this embodiment of the present invention, an OLED display panel will be exemplarily described. All the components of the display apparatus according to all embodiments of the present invention are operatively coupled and configured.

Referring to FIGS. 1 and 2, a display apparatus 100 according to this embodiment of the present invention can have an approximately rectangular shape. However, the display apparatus 100 is not limited to the rectangular shape, and can be manufactured to have any of various shapes, such as a polygonal shape or a curved shape. The display apparatus 100 can include a display panel 110 and a back cover 120.

The display apparatus 100 can be in a state in which a display function and a touch function are integrated, a cover window can be adhered to the front surface of the display apparatus 100, and the cover window can be a cover glass formed of glass.

The back cover 120 is arranged on the rear surface of the display panel 110. The rear surface of the display panel 110 and the front surface of the back cover 120 can be adhered to each other using a double-sided tape. Of course, the adhesion structure between the display panel 110 and the back cover 120 is not limited thereto, and the display panel 110 and the back cover 120 can be adhered to each other using an adhesive or a resin. Since the front surface of the back over 120 adhered to the rear surface of the display panel 110 is maintained flat, a uniform air gap can be maintained between the display panel 110 and the back cover 120, thereby being capable of providing effects, such as improvement in heat radiation performance and removal of an afterimage thereby.

The back cover 120 can have a shape corresponding to the shape of the display panel 110. The back cover 120 can support the rear surface of the display panel 110 and thus compensate for poor stiffness of the display panel 110. Further, the back cover 120 can be formed of metal so as to perform a function of radiating heat generated in the display panel 110 or a circuit board 130 coupled to the display panel 110.

The back cover 120 can have an approximately rectangular shape, and edge areas of the back cover 120 adjacent to the respective side surfaces thereof can include a hemming part 121 formed by performing bending at least once.

Figure 3:
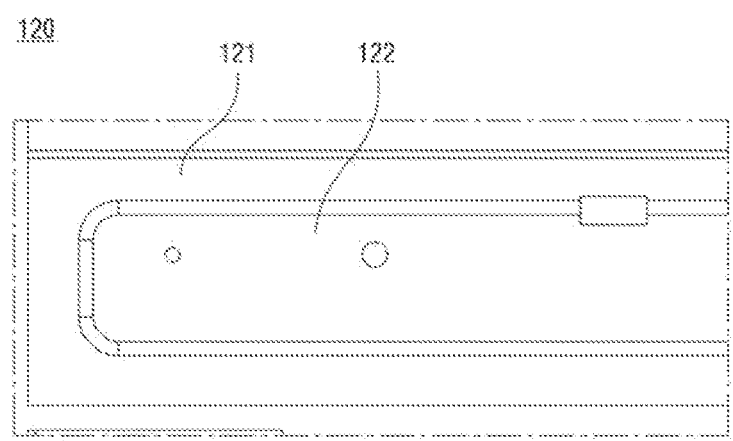
FIG. 3 is a partially enlarged view illustrating region A of the back cover shown in FIG. 2.
Figure 4:
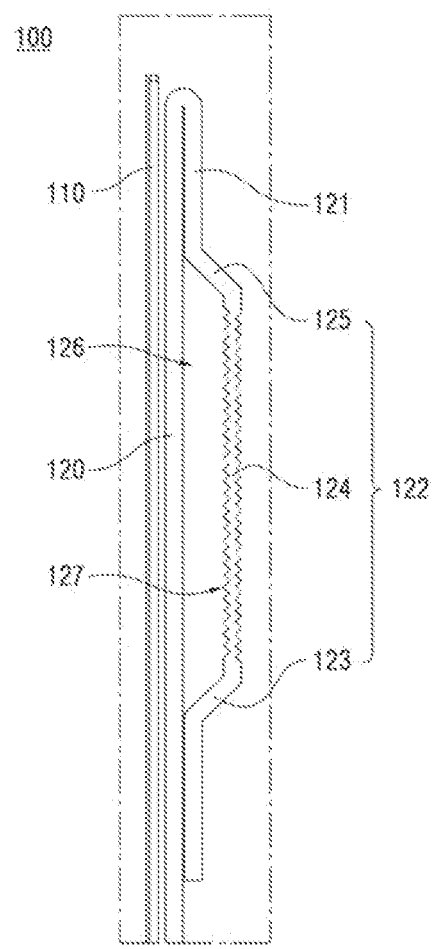
FIG. 4 is a cross-sectional view of the back cover, taken along line I-I' of FIG. 2.
Figure 5:
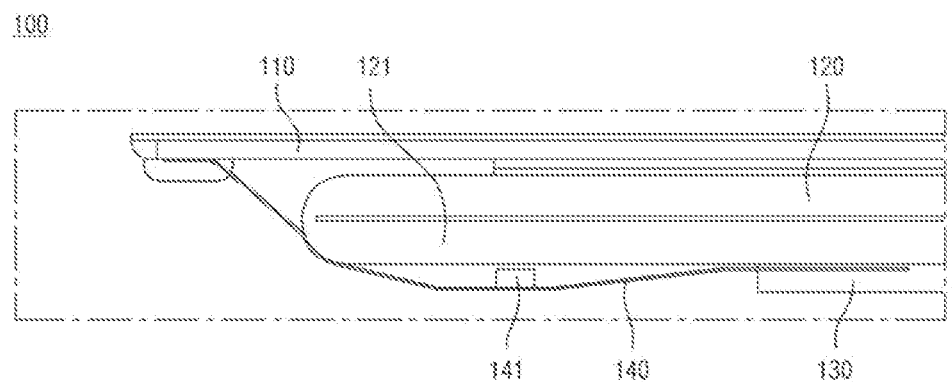
FIG. 5 is a cross-sectional view of the back cover, taken along line II-II' of FIG. 2.

FIG. 3 is a partially enlarged view illustrating region A of the back cover shown in FIG. 2, FIG. 4 is a cross-sectional view of the back cover, taken along line I-I' of FIG. 2, and FIG. 5 is a cross-sectional view of the back cover, taken along line II-II' of FIG. 2.

Referring to FIGS. 3 to 5, in the display apparatus 100 according to one or more examples of the present invention, the hemming part 121 is formed to face the rear surface of the back cover 120 by bending the end of the back cover 120. Since the hemming part 121 is formed by bending some areas of the back cover 120, the hemming part 121 is doubled so as to face the rear surface of the back cover 120, without adding a separate element, thus being capable of increasing stiffness of the display apparatus 100. The hemming part 121 can be arranged adjacent to the edge areas of the display panel 110, and be designed to be located in the edge areas towards the central area of the display panel 110. Further, the hemming part 121 can be provided at one edge adjacent to one side surface of the back cover 120 or be provided selectively at some or all of edges adjacent to all side surfaces of the back cover 120.

Further, the hemming part 121 can include a forming part 122 protruding outwards from the hemming part 121.

The forming part 122 can have a shape protruding from the hemming part 121 by pressing the hemming part 121 or further bending the hemming part 121. For example, the hemming part 121 is formed to face the rear surface of the back cover 120 and thus contacts or is arranged adjacent to the rear surface of the back cover 120, and the forming part 122 is formed integrally with the hemming part 121 so as to protrude further outwards than the hemming part 121, and is thus arranged so as to be spaced apart from the rear surface of the back cover 120. Of course, a portion of the forming part 122 can be arranged to face the rear surface of the back cover 120.

The forming part 122 can include a first plane 123 which is bent from one side end of the back cover 120 or the hemming part 121, a second plane 124 which is bent from the first plane 123, and a third plane 125 which is bent from the second plane 124 and then connected to the hemming part 121. For example, referring to FIG. 4, the first plane 123 can be bent from the end of the hemming part 121 in a diagonal direction, the second plane 124 can connect the first plane 123 to the third plane 125, and the third plane 125 can be arranged adjacent to the hemming part 121 bent from the edge area of the back cover 120. The first plane 123 and the third plane 125 can be arranged in a diagonal direction or an orthogonal direction from the second plane 124. Therefore, a space 126 can be formed between the second surface 124 and the back cover 120. When the space 126 is filled with heated air due to heat radiation, heat can move towards a region having a relatively low temperature in the space 126, and thereby, heat radiation performance can be increased. For example, heat transfer can be performed by movement of air filling the space 126 through convection.

Further, a heat radiation pattern 127 can be provided on the forming part 122 so as to increase a heat transfer area with heated air within the space 126. Referring to FIG. 4, the heat radiation pattern 127 is provided on the inner and outer surfaces of the second plane 124. Of course, the heat radiation pattern 127 can be provided on the first plane 123 and the third plane 125, and the heat radiation pattern 127 can be formed on only any one of the inner and outer surfaces of the first and third planes 123 and 125.

Further, as shown in FIG. 5, the circuit board 130 connected to the display panel 110 can be mounted on the hemming part 121. The hemming part 121 corresponds to a part having a large thickness formed by bending the back cover 120, thus being capable of reducing transfer of heat generated in the circuit board 130 to the display panel 110. Further, a driver IC 141 can be provided on a flexible circuit board 140 which connects the circuit board 130 to the display panel 110. The driver IC 141, which also generates heat, can be arranged on the hemming part 121. Further the circuit board 130 or the driver IC 141 can be arranged on the forming part 122.

Figure 6:
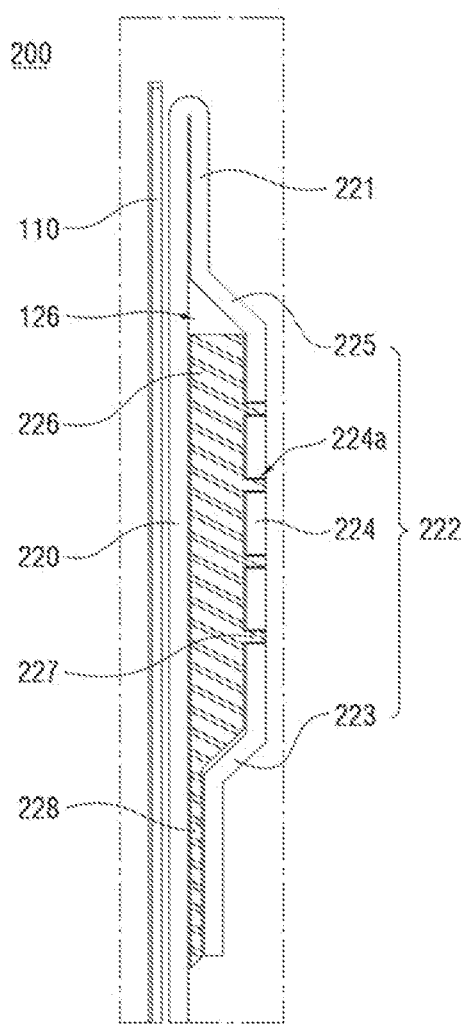
FIG. 6 is a cross-sectional view of a back cover according to another embodiment, taken along line I-I' of FIG. 2.

FIG. 6 is a cross-sectional view of a back cover according to another embodiment, taken along line I-I' of FIG. 2.

Referring to FIG. 6, a back cover 220 can include a hemming part 221. Further, the hemming part 221 can include a forming part 222. The forming part 222 can include a first plane 223, a second plane 224 and a third plane 225. Here, parts in this embodiment which are substantially the same as those in the former embodiment are denoted by the same reference numerals, even though they are depicted in different drawings.

A space 126 can be formed on the rear surface of the back cover 220 due to the protruding height of the forming part 222, and a heat radiation member 226 having high heat transfer efficiency can be provided within the space 126. The heat radiation member 226 can be coupled to the inside of the space 126, or fill the inside of the space 126 using a foaming method. When the heat radiation member 226 is coupled to the inside of the space 126, the heat radiation member 226 can first be coupled to the inner surface of the forming part 222, as shown in FIG. 6. For example, after the heat radiation member 226 is coupled to the inner surface of the second plane 224, the back cover 220 can be bent to form the hemming part 221.

The heat radiation member 226 can include a plurality of heat radiation pins 227, which are inserted into heat radiation holes 224a formed through the second plane 224. Although FIG. 6 illustrates a structure in which the heat radiation pins 227 are inserted only into the heat radiation holes 224a, the heat radiation pins 227 can be exposed to the outside from the outer surface of the second plane 224. For example, the heat radiation pins 227 can protrude from the heat radiation member 226, be inserted into the heat radiation holes 224a, pass through the heat radiation holes 224a, and be pressed onto the outer surface of the second plane 224, thus being exposed to have a flange shape or being exposed through riveting. Therefore, these structures of the heat radiation member 226 and the heat radiation pins 227 can increase the heat radiation performance of the display apparatus 200, and thereby, overcome generation of an afterimage due to degradation of the display panel 110 or poor colors.

Further, the heat radiation member 226 can include an extension member 228 which extends between the first plane 223 and the rear surface of the back cover 220 so that a portion of the extension member 228 is exposed to the rear surface of the back cover 220. The extension member 228 can transfer heat of the heat radiation member 226 to the outside of the hemming part 221 through heat conduction. Further, the first plane 223 and the extension member 228 can be coupled using the structures of the heat radiation pins 227 and the heat radiation holes 224a. The extension member 228 can be formed integrally with the heat radiation member 226.

Here, the heat radiation member 226, the heat radiation pins 227 and the extension member 228 can be formed of at least one of materials having excellent thermal conductivity, i.e., at least one of gold, silver, magnesium, aluminum, carbon fiber, graphite or graphene. Alternatively, the heat radiation member 226, the heat radiation pins 227 and the extension member 228 can be formed of an alloy of these materials.

The display apparatus according to one embodiment of the present invention can include the hemming part in the edge areas of the back cover so as to increase stiffness of a frame structure configured to support the display panel, allow the surface of the back cover adhered to the rear surface of the display panel to be maintained flat and thus maintain a uniform air gap without adding an inner plate so as to achieve improvement in heat radiation performance and removal of an afterimage, include the forming part formed at the hemming part so as to facilitate coupling of the display panel to a mechanical structure configured to support the rear surface of the display panel, and form the space between the back cover and the hemming part due to the forming part and provide the heat radiation member within the space so as to increase heat radiation performance.

Further, according to an embodiment, a back cover for a display including a display panel is provided, wherein the back cover includes a hemming part (e.g., 121, 221, etc.) that includes a first part facing a rear surface of the display panel (e.g., part directly facing the rear surface of the display panel), a second part extending from the first part and being bent at an end area of the back cover, and a third part (e.g., 122, 222, etc.) extending from the second part and protruding outwardly from the second part.

As is apparent from the above description, a display apparatus in accordance with one or more embodiments of the present invention has the following effects and advantages.

First, the display apparatus includes a hemming part in the edge areas of a back cover, thereby being capable of increasing stiffness of a frame structure configured to support a display panel.

Second, the surface of a back cover adhered to the rear surface of the display panel can be maintained flat and thus maintain a uniform air gap without adding an inner plate, thereby achieving improvement in heat radiation performance and removal of an afterimage.

Third, a forming part is formed at the hemming part, thereby facilitating coupling of the display panel to a mechanical structure configured to support the rear surface of the display panel.

Fourth, a space between the back cover and the hemming part is formed due to the forming part and a heat radiation member is provided within the space, thereby being capable of increasing heat radiation performance.

The features, structures and effects described in the above embodiments of the present invention are included in at least one embodiment of the present invention, and are not limited to one embodiment. Further, it will be apparent to those skilled in the art that the features, structures and effects described in the at least one embodiment of the present invention can be combined or modified in other embodiments. Therefore, the content related to these combinations and modifications should be interpreted as being included in the scope of the invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display apparatus comprising:
   a display panel; and
   a back cover coupled to a rear surface of the display panel,
   wherein the back cover comprises a hemming part formed to face a rear surface of the back cover by bending at least a portion of the back cover,
   wherein the hemming part is bent from an edge area of the back cover,
   wherein the hemming part comprises a forming part bent to protrude outwardly, and
   the forming part comprises:
   a first plane, a second plane, and a third plane,
   wherein the first plane is configured to be bent from an end of the hemming part in a diagonal direction, the second plane is configured to connect the first plane to the third plane, and the third plane is configured to be arranged adjacent to the hemming part bent from the edge area of the back cover.

2. The display apparatus according to claim 1, wherein:
   the back cover is formed in a predetermined shape; and
   the hemming part is provided in respective edge areas of the back cover.

3. The display apparatus according to claim 2, wherein the predetermined shape is a rectangular shape.

4. The display apparatus according to claim 2, further comprising a circuit board coupled to the hemming part on the rear surface of the back cover.

5. The display apparatus according to claim 1, wherein the hemming part further comprises a space between the rear surface of the back cover and the forming part.

6. The display apparatus according to claim 5, wherein the hemming part further comprises a heat radiation member inserted into the space between the rear surface of the back cover and the forming part.

7. The display apparatus according to claim 6, wherein the heat radiation member comprises heat radiation pins coupled to heat radiation holes formed through the forming part.

8. The display apparatus according to claim 6, wherein the heat radiation member comprises an extension member configured to extend between the first plane and the back cover so that at least a portion of the extension member is exposed to an outside of the space between the rear surface of the back cover and the forming part.

9. The display apparatus according to claim 1, wherein the forming part further comprises a heat radiation pattern provided on at least one of the first plane, the second plane or the third plane.

10. A back cover for a display device including a display panel, the back cover comprising:
    a hemming part including a first part facing a rear surface of the display panel, a second part extending from the first part and being bent at an end area of the back cover, and a third part extending from the second part and protruding outwardly from the second part,
    wherein the third part of the hemming part includes:
    a first plane, a second plane, and a third plane,
    wherein the first plane is configured to be bent from an end of the second part in a diagonal direction, the second plane is configured to connect the first plane to the third plane, and the third plane is configured to be arranged adjacent to the hemming part bent from the end area of the back cover.

11. The back cover according to claim 10, wherein the hemming part further comprises a space between the first part and the third part.

12. The back cover according to claim 11, wherein the hemming part further comprises a heat radiation member inserted into the space between the first part and the third part.

13. The back cover according to claim 10, wherein the hemming part is provided in respective edge areas of the back cover.

* * * * *